United States Patent
Onishi et al.

(10) Patent No.: US 8,748,074 B2
(45) Date of Patent: Jun. 10, 2014

(54) SELF-IMAGEABLE FILM FORMING POLYMER, COMPOSITIONS THEREOF AND DEVICES AND STRUCTURES MADE THEREFROM

(75) Inventors: Osamu Onishi, Tokyo (JP); Haruo Ikeda, Tokyo (JP); Larry F. Rhodes, Silver Lake, OH (US); Pramod Kandanarachchi, Brecksville, OH (US)

(73) Assignees: Promerus, LLC, Brecksville, OH (US); Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/303,423

(22) Filed: Nov. 23, 2011

(65) Prior Publication Data

US 2012/0129101 A1    May 24, 2012

Related U.S. Application Data

(60) Provisional application No. 61/416,950, filed on Nov. 24, 2010.

(51) Int. Cl.
*G03F 7/023* (2006.01)
*G03F 7/038* (2006.01)

(52) U.S. Cl.
USPC ........... 430/192; 430/191; 430/914; 430/925; 430/311; 430/270.1; 430/280.1

(58) Field of Classification Search
None
See application file for complete search history.

(56) References Cited

U.S. PATENT DOCUMENTS

| 4,388,451 | A | * | 6/1983 | Culbertson et al. | 526/271 |
| 4,959,293 | A | * | 9/1990 | Schwartzkopf et al. | 430/189 |
| 5,462,840 | A | * | 10/1995 | Vicari | 430/326 |
| 6,147,177 | A | * | 11/2000 | Jayaraman et al. | 526/281 |
| 6,190,824 | B1 | * | 2/2001 | Fukushige et al. | 430/163 |
| 7,524,594 | B2 | * | 4/2009 | Amoroso et al. | 430/18 |
| 2008/0194740 | A1 | * | 8/2008 | Elce et al. | 524/82 |
| 2011/0070543 | A1 | * | 3/2011 | Knapp et al. | 430/280.1 |
| 2011/0104614 | A1 | * | 5/2011 | Onishi et al. | 430/280.1 |

FOREIGN PATENT DOCUMENTS

| EP | 0 921 439 A1 | * | 6/1999 |
| EP | 0 989 462 A1 | * | 3/2000 |
| WO | WO 2012/071496 A1 | * | 5/2012 |

OTHER PUBLICATIONS

Ito, Hiroshi "Chemical Amplification Reisist for Microlithography", Adv Polym Sci (2005) vol. 172, only pp. 37-96 of the article.*
L. F. Thompson, C. G. Willson and M.J. Bowden, "Organic Resist Materials", Introduction to Microlithography, 1994, pp. 212-232.
H. Ito, "Dissolution behavior of chemically amplified resist polymers for 248-, 193-, and 157-nm lithography", IBM J. Res. & Dev., 2001, vol. 45(5), pp. 683-695.

* cited by examiner

*Primary Examiner* — Cynthia Hamilton
(74) *Attorney, Agent, or Firm* — Balaram Gupta; Michael W. Ferrell

(57) ABSTRACT

Polymers and compositions for forming self-imageable films encompassing such polymers that encompass norbornene-type repeating unit having at least one phenolic functionality and maleic anhydride-type repeating unit, which can be formulated to be either positive tone imaging or negative tone imaging. The films formed thereby are useful as self-imageable layers in the manufacture of microelectronic, such as semiconductor, and optoelectronic devices.

19 Claims, No Drawings

SELF-IMAGEABLE FILM FORMING POLYMER, COMPOSITIONS THEREOF AND DEVICES AND STRUCTURES MADE THEREFROM

CROSS-REFERENCED TO RELATED APPLICATION

This application is entitled to and claims priority to the U.S. Provisional Patent having Ser. No. 61/416,950, filed Nov. 24, 2010, and entitled "A Self-Imageable Film Forming Polymer, Compositions Thereof and Devices and Structures Made Therefrom." Such Provisional Patent is incorporated herein by reference in its entirety.

TECHNICAL FIELD

The present disclosure relates generally to polymers that encompass both norbornene-type repeating units and non-norbornene-type repeating units that are useful in polymer compositions directed to forming self-imageable films, and more specifically to such polymers that encompass norbornene-type repeating units with pendent groups having phenolic functionality and maleic anhydride-type repeating units. Such polymers being useful in polymer compositions that can provide a film that is self-imageable when image-wise exposed to actinic radiation.

BACKGROUND

The microelectronic, such as semiconductor and optoelectronic, industries have seen the requirement for smaller and smaller device geometries over the past several years. While in some areas of device fabrication sub-micron device geometries have been common place for a number of years, in other areas, such as liquid crystal displays (LCDs), organic light emitting diodes (OLEDs) and a variety of radio frequency (RD and microwave devices (e.g. RFICs/MMICs, switches, couplers, phase shifters, SAW filters and SAW duplexers), such device geometries are only recently approaching the 1 to 5 micron level. As a result, for these latter areas, imaging layers sensitive to deep UV radiation (e.g., 248 nm) are desirable.

As a result, new photopolymers based on poly(hydroxystyrene) (PHS) and chemical amplification strategies were developed to initially meet that desire. (Introduction to Microlithography by L. F. Thompson, C. G. Willson and M. J. Bowden, 1994, p. 212-232 and H. Ito, IBM J. Res. Dev., 2001, 45(5) 683). While PHS is relatively transparent to 248 nm light, as compared to novolak, it has been reported that "PHS and its derivatives . . . have unfavorable dissolution and inhibition properties compared to novolaks." (Dammel, et al. Proceedings of SPIE—The International Society for Optical Engineering (1994), 2195 (Advances in Resist Technology and Processing XI), 542-58). In this regard, adding dissolution rate inhibitors such as diazonaphthoquinone (DNQ), which approach had been successful with novolaks, for positive tone systems, was problematic for PHS. Thus, the aforementioned chemical amplification approach was developed. However, PHS photoresists are known to have limited thermal stability and limited resistance to common dry etch processing. Imageable polymers that consist of norbornene-type repeating units are known for their excellent thermal stability, low dielectric constant and etch resistance. Therefore, it is believed that it would be advantageous to provide polymers that would be useful for forming photoresist compositions that are sensitive to actinic radiation and that exhibit enhanced thermal stability and etch resistance as compared to currently known PHS systems. Thus, polymers encompassing repeating units derived from norbornene-type monomers and appropriate non-norbornene-type monomers, polymer compositions thereof and the use of such compositions are described hereinafter.

DETAILED DESCRIPTION

Embodiments in accordance with the present disclosure are directed to polymers that encompass at least one norbornene-type repeating unit that has at least one phenolic functionality and at least one maleic anhydride-type repeating unit as defined herein and polymer compositions comprising such polymers. Such polymer compositions may be capable of forming films useful as self-imageable layers in the manufacture of microelectronic and optoelectronic devices. That is to say that, after image-wise exposure to actinic radiation, such layers (or films) can be developed to form patterned layers (or films), where such pattern is reflective of the image through which the layers (or films) was exposed. In this manner, structures can be provided that are, or are to become, a part of such microelectronic and/or optoelectronic devices.

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all subranges subsumed therein. For example, a stated range of from "1 to 10" should be considered to include any and all subranges between the minimum value of 1 and the maximum value of 10. Exemplary subranges of the range 1 to 10 include, but are not limited to, 1 to 6.1, 3.5 to 7.8, and 5.5 to 10.

As used herein, the term "polymer" is meant to encompass both homopolymers (polymers having only one type of repeating unit) and copolymers (a polymer having more than one type of repeating unit).

As used herein, the term "polymer composition" is meant to include at least one synthesized polymer, as well as residues from initiators, solvents or other elements attendant to the synthesis of such polymers, where such residues are understood as not being covalently incorporated thereto. Such residues and other elements considered as part of the polymer composition are typically mixed or co-mingled with the polymer such that they tend to remain therewith when it is transferred between vessels or between solvent or dispersion media. A polymer composition can also include materials added after synthesis of the polymer to provide or modify specific properties of such composition.

As used herein, "hydrocarbyl" refers to a radical of a group that contains only carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, "alkyl" refers to a linear or branched acyclic or cyclic, saturated hydrocarbon group having a carbon chain length of for example, from appropriate $C_1$ to $C_{25}$ groups. Non-limiting examples of suitable alkyl groups include, but are not limited to, —$(CH_2)_3CH_3$, —$(CH_2)_4CH_3$, —$(CH_2)_5CH_3$, —$(CH_2)_9CH_3$, —$(CH_2)_{23}CH_3$, cyclopentyl, and cyclohexyl.

As used herein the term "aryl" refers to aromatic groups that include, without limitation, groups such as phenyl, biphenyl, benzyl, xylyl, naphthalenyl, anthracenyl and the like.

The terms "alkaryl" or "aralkyl" are used herein interchangeably and refer to a linear or branched acyclic alkyl group substituted with at least one aryl group, for example, phenyl, and having an alkyl carbon chain length of appropriate $C_1$ to $C_{25}$. It will further be understood that the above acyclic alkyl group can be a haloalkyl or perhaloakyl group.

As used herein the term "alkenyl" refers to a linear or branched acyclic or cyclic hydrocarbon group having at least one double bond and having an alkenyl carbon chain length of appropriate $C_2$ to $C_{25}$. Non-limiting examples include, among others, vinyl groups, propylene, butenes and the like.

As used herein the term "heterohydrocarbyl" refers to any of the previously described hydrocarbyls, halohydrocarbyls and perhalohydrocarbyls where at least one carbon of the carbon chain is replaced with N, O, S, Si or P. Non-limiting examples include heterocyclic aromatic groups such as pyrrolyl, furanyl, and the like, as well as non-aromatic groups such as ethers, thioethers and silyl ethers. The term "alkylol" refers to alkyl groups that include at least one hydroxyl group.

It will additionally be understood that any of the hydrocarbyl, halohydrocarbyl, perhalohydrocarbyl and heterohydrocarbyl moieties described above can be further substituted, if desired. Non-limiting examples of suitable substituent groups include, among others, hydroxyl groups, benzyl groups, carboxylic acid and carboxylic acid ester groups, amides and imides.

Embodiments in accordance with the present disclosure encompass polymers comprising at least one norbornene-type repeating unit having at least one phenolic functionality as defined below and at least one maleic anhydride-type repeating unit as defined below in Formula II. Each type of repeating unit is defined below in terms of the monomers from which such repeating units are derived.

The terms "norbornene-type", "polycycloolefin" and "poly(cyclic) olefin" are used interchangeably herein and refer to monomers (or the resulting repeating unit), that encompass at least one norbornene moiety such as the moiety shown below:

The simplest norbornene-type or poly(cyclic) olefin monomer is the bicyclic monomer bicyclo[2.2.1]hept-2-ene, commonly referred to as norbornene. As described above, the term "norbornene-type" monomer or repeating unit is used herein to encompass norbornene itself as well as any substituted norbornene(s), and any substituted and unsubstituted higher cyclic derivatives thereof. Formula I, shown below, is representative of norbornene-type monomers:

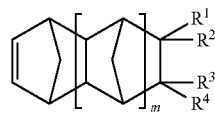

I where m is an integer ranging from 0 to 5 and each occurrence of $R^1$, $R^2$, $R^3$, and $R^4$ independently represents hydrogen, a hydrocarbyl, or another substituent, such as a linear or branched carboxylic acid ester, ether, a secondary or tertiary alcohol, or such as groups A, B, or C described below or a carbonyl group, with the proviso that such groups are not acid labile groups.

As used herein, the term norbornene-type monomer or repeating units "having at least one phenolic functionality" is understood to refer to norbornene-type monomers or repeating units as defined above that encompass at least one phenol-type moiety. As used herein, "phenol-type moiety" will be understood to refer to a group or substituent comprising at least one phenol ring. Non-limiting examples of norbornene-type monomers of Formula I that have at least one phenolic functionality include those shown below in Monomer Group DD, including those of Formula I wherein at least one of $R^1$ to $R^4$ is a group represented by group L shown below.

As used herein, the term "maleic anhydride-type" will be understood to refer to monomers (or the resulting repeating unit), that encompass at least one maleic anhydride-type moiety such as the moiety shown below:

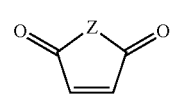

II where Z is O or $NR^5$, where $R^5$ is hydrogen or R*—OH, where R* is an alkyl, aryl, or alkaryl linking group. Non-limiting examples of R* include, but are not limited to, methyl, ethyl, isopropyl, benzyl, and tolyl. When Z is O, Formula II is a maleic anhydride moiety, and when Z is $NR^5$, Formula II is a maleimide moiety, but as both maleic anhydride and maleimide structures are analogs, both are referred to as "maleic anhydride-type" herein, for simplicity.

Useful monomers for embodiments in accordance with the present disclosure are described generally herein and are further described by the monomer and substituent structures provided herein. With regard to the polymer composition embodiments of the present disclosure, it will be noted that such compositions can encompass a single polymer comprising at least one norbornene-type repeating unit having at least one phenolic functionality and at least one maleic anhydride-type repeating unit. In other embodiments, such polymer compositions can encompass a single polymer comprising at least one norbornene-type repeating unit having at least one phenolic functionality, at least one maleic anhydride-type repeating unit, and at least one norbornene-type repeating unit different from the at least one norbornene-type repeating unit having at least one phenolic functionality, such as those in Monomer Groups CC and EE shown below.

In still other embodiments, the polymer compositions can encompass a blend of polymers comprising at least two polymers where at least one of such polymers can be a homopolymer. Such blend of polymers can also encompass at least one polymer comprising at least one norbornene-type repeating unit having at least one phenolic functionality and at least one maleic anhydride-type repeating unit described herein, and/ or at least one polymer comprising at least one norbornene-type repeating unit having at least one phenolic functionality, at least one maleic anhydride-type repeating unit, and at least one norbornene-type repeating unit different from the at least one norbornene-type repeating unit having at least one phenolic functionality.

When any of $R^1$, $R^2$, $R^3$ and $R^4$ is a hydrocarbyl group, such group can be a $C_1$ to $C_{30}$ alkyl, aryl, aralkyl, alkaryl, cycloalkyl, or alkylsilyl group. Representative alkyl groups include, but are not limited to, methyl, ethyl, propyl, isopropyl, butyl, isobutyl, sec-butyl, tert-butyl, pentyl, neopentyl, hexyl, heptyl, octyl, nonyl, and decyl. Representative cycloalkyl groups include, but are not limited to, cyclopentyl, cyclohexyl, and cyclooctyl. Representative aryl groups include, but are not limited to, phenyl, naphthyl, and anthracenyl. Representative aralkyl groups include, but are not limited to, benzyl and phenethyl. In addition, it should be noted that the hydrocarbyl groups mentioned above can be substituted, that is to say at least one of the hydrogen atoms can be replaced with, for example, $C_1$-$C_{10}$ alkyl, haloalkyl, perhaloalkyl, aryl, and/or cycloalkyl group(s).

Any one or more of $R^1$ to $R^4$ can also be a halohydrocarbyl group, where such group includes any of the hydrocarbyls mentioned above where at least one, but less than all, of the hydrogen atoms of the hydrocarbyl is replaced by a halogen (fluorine, chlorine, bromine or iodine). Additionally, any one or more of $R^1$ to $R^4$ can be a perhalocarbyl group, where such group includes any of the hydrocarbyls mentioned above where all of the hydrogen atoms of the hydrocarbyl are replaced by a halogen. Representative perfluorinated substituents include, but are not limited to, perfluorophenyl, perfluoromethyl, perfluoroethyl, perfluoropropyl, perfluorobutyl, and perfluorohexyl.

In some embodiments, monomers in accordance with Formula I, can encompass perhalohydrocarbyl groups that can include perhalogenated phenyl and perhalogenated alkyl groups. In other embodiments, the perfluorinated croups can include pertluorophenyl, perfluoromethyl, perfluoroethyl, perfluoropropyl, perfluorobutyl, and perfluorohexyl. In addition to halogen substituents, cycloalkyl, aryl and aralkyl groups of such embodiments can be substituted with any $C_1$-$C_5$ alkyl, $C_1$-$C_5$ haloalkyl, aryl, and/or cycloalkyl group. Non-limiting examples of monomers of the norbornene-type of Formula I include those shown below in Monomer Groups CC, DD and EE, with Monomer Group DD comprising monomers of the norbornene-type having at least one phenolic functionality.

In some other embodiments, monomers in accordance with Formula I, can encompass the norbornene-type monomers of Monomer Group EE which includes 5-(2-hydroxy-2,2-bistrifluoromethyl)ethyl-2-norbornene (HFANB), among others, as well as 5-norbornene-2-methanol hydroxylethylether, 5-norbornene-2-methanol acetate, and 5-triethoxy-silylnorbornene.

In still other embodiments, at least one of $R^1$ to $R^4$ of a monomer in accordance with Formula I is a $QNHSO_2R^8$ group or a $Q(CO)O$—$(CH_2)_m$—$R^8$ group, where Q is an optional alkyl or heteroalkyl spacer of 1 to 5 carbons (inclusive of any heteroatoms that may be present), m is an integer ranging from 0 to 3 inclusive, and $R^8$ is a perhalo group of 1 to 10 carbon atoms.

In some embodiments, at least one of $R^1$ to $R^4$ of a monomer represented by Formula I is one of Radical Formulae A, B or C:

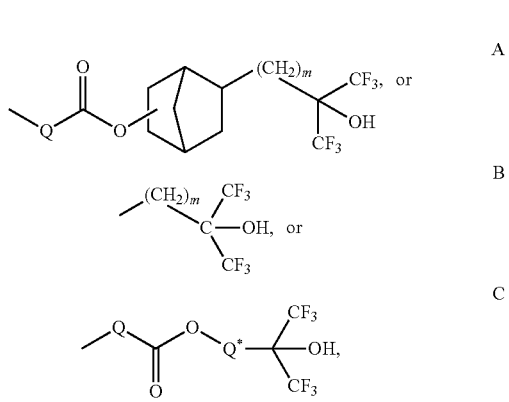

where m and Q are as defined above and Q* is an alkyl spacer of 1 to 5 carbons.

In some embodiments encompassing group A, Q is not present or is a linear alkyl spacer of 1 to 3 carbons. In other such embodiments, Q is either not present or is I carbon atom. In some embodiments encompassing group C, Q* is an alkyl spacer of 3 or 4 carbons. In some embodiments encompassing group B, m is either 1 or 2. In some embodiments, in Formula I, one of $R^1$ to $R^4$ is group B and the others are each hydrogen, n is 0, and m is 1.

For embodiments of norbornene-type monomers, represented by Formula I, having at least one phenolic functionality at least one of $R^1$ to $R^4$ is a group represented by group L:

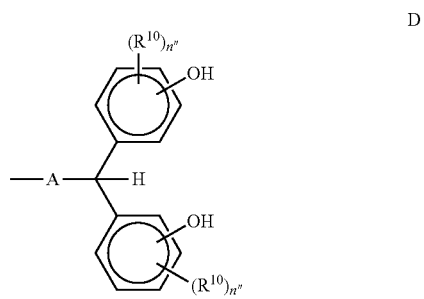

where for Radical Formula D, A is an optional alkyl or cycloalkyl group having from 1 to 6 or 4 to 12 carbons, respectively, if present. Where A is not present, the polycyclic ring(s) are either directly joined with the carbon connecting the phenol moieties or the phenol moieties are directly joined to a polycyclic ring carbon. Each $R^{10}$ is independently selected from H, a halogen, a monovalent hydrocarbon, an alkoxy, an aryloxy, or an electron withdrawing group, such as —CN, —$CF_3$ or the like, where such monovalent hydrocarbon is a $C_1$ to $C_6$ alkyl, a $C_6$ to $C_{12}$ aryl, or a $C_7$ to $C_1$ alkaryl, where such alkoxy has from 1 to 6 carbons, and where such aryloxy has from 6 to 12 carbons; and each n" is independently an integer ranging from 0 to 4.

As mentioned above, non-limiting examples of norbornene-type monomers represented by Formula I encompass those shown below in Monomer Groups CC, DD and EE, where Monomer Group DD are monomers of the norbornene-type having at least one phenolic functionality.

Monomer Group CC
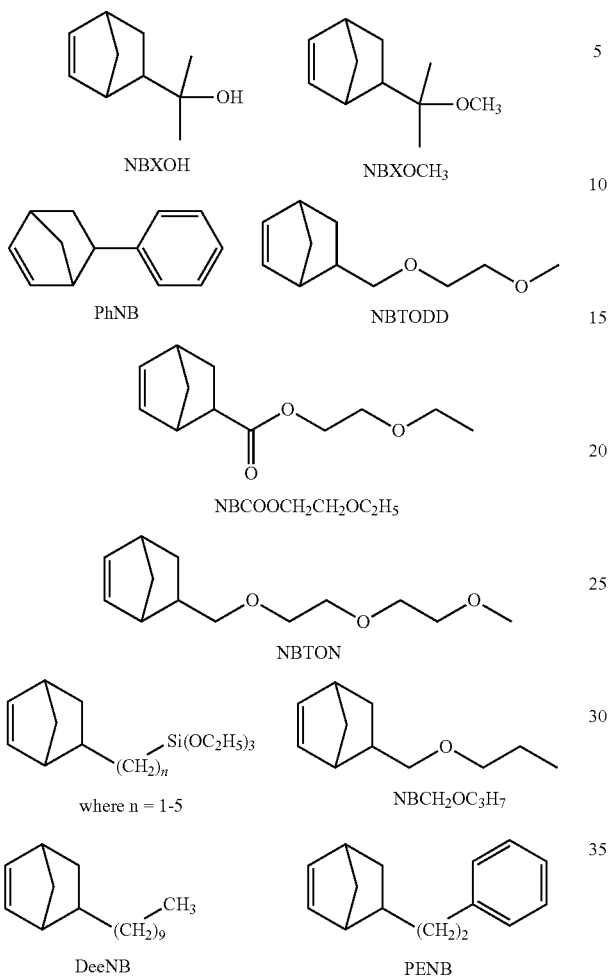
Monomer Group DD
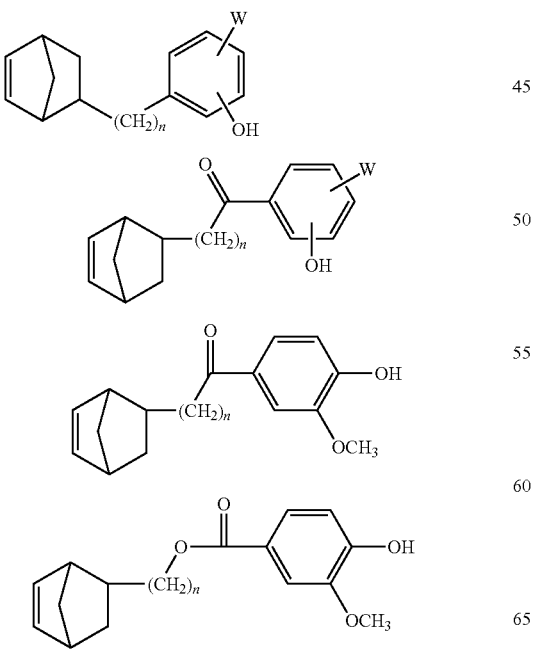
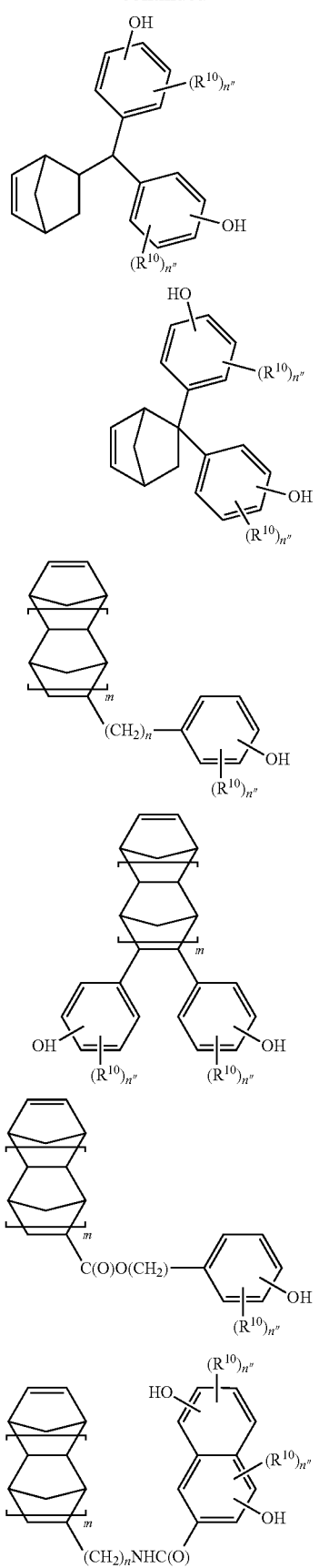

-continued

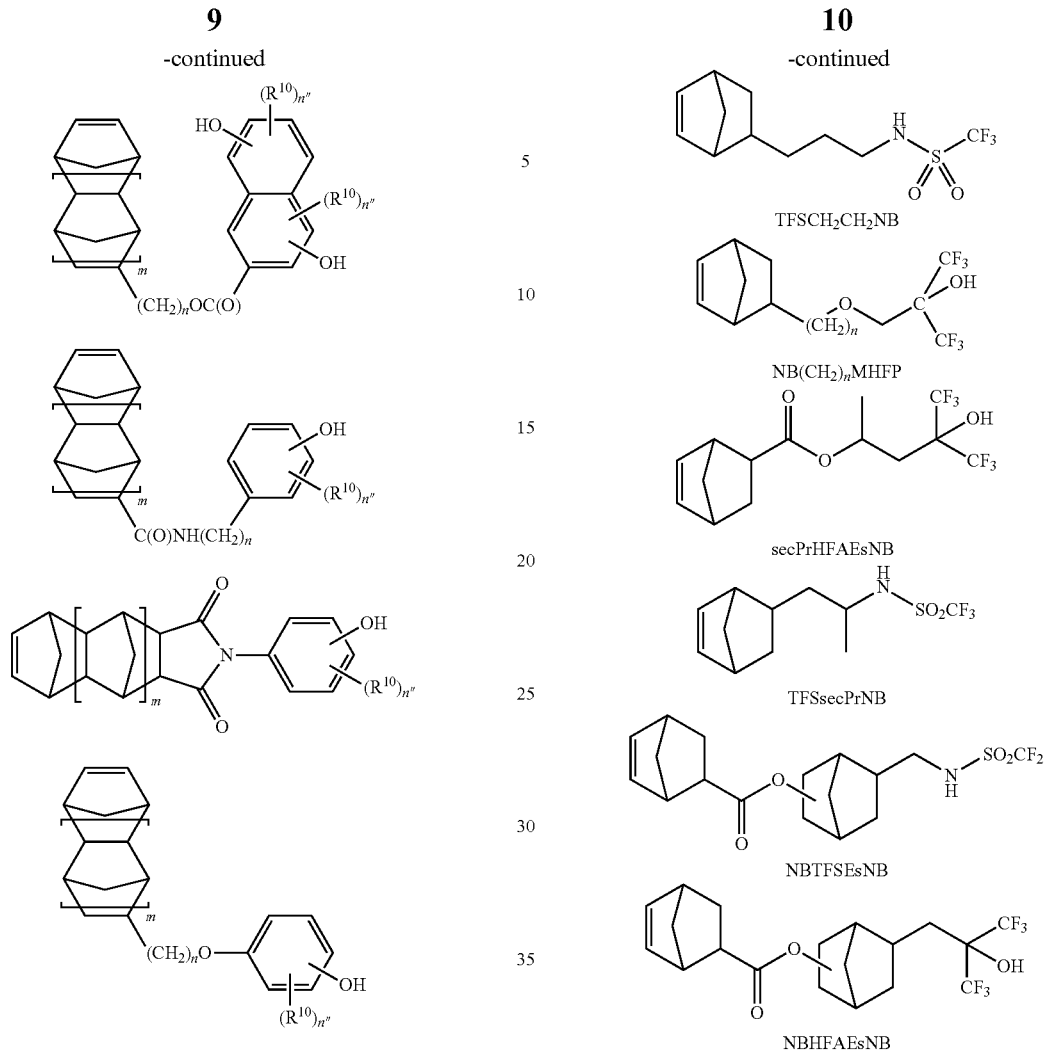

where for Monomer Group DD, n is an integer from 1 to 5; W is H, an alkyl, ether, or ketone; m is as defined above for Formula I; and $R^{10}$ and n" are as defined above for Radical Formula D.

Monomer Group EE

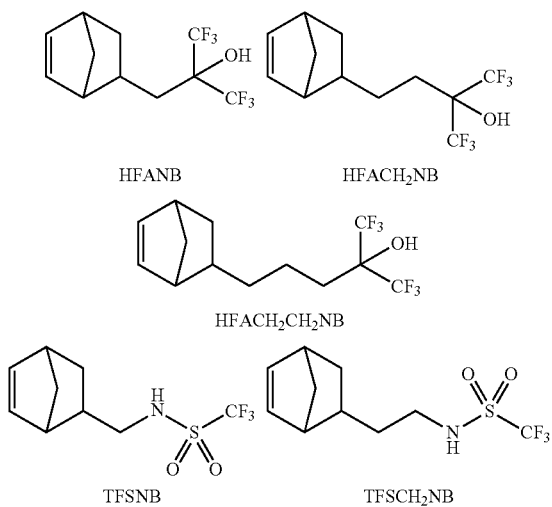

As mentioned above, embodiments in accordance with the present disclosure are directed to polymers comprising at least one norbornene-type repeating unit having at least one phenolic functionality and at least one maleic-anhydride type repeating unit and polymer compositions comprising such polymers. Such polymer compositions may be capable of forming films useful as self-imageable layers in the manufacture of microelectronic, such as semiconductor, and optoelectronic devices. That is to say that when image-wise exposed to actinic radiation, such layers (or films) can be developed to form a patterned film, where such pattern is reflective of the image through which the film was exposed.

In this manner, structures can be provided that are, or are to become, a part of such microelectronic and/or optoelectronic devices. For example, such films may be useful as planarization layers in liquid crystal displays or as a buffer or redistribution layer in microelectronic devices. Additionally, such films may be useful for forming MEMS (micro-electro-mechanical structure) devices. It will be noted that such examples are only a few of the many uses for such a self-imageable film, and such examples do not serve to limit the scope of such films or the polymers and polymer compositions that are used to form them.

Thus embodiments in accordance with the present disclosure encompass polymers comprising repeating units derived from the monomers described herein and which polymers are obtainable via free radical polymerization reaction using methods known to those skilled in the art. Non-limiting examples of initiators that may be used in the free radical polymerization reaction include, for instance, azo compounds and organic peroxides. Non-limiting examples of azo compounds include azobisisobutyronitrile (MBN), (E)-dimethyl-2,2'-(diazene-1,2-diyl)-bis(2-methylpropanoate (AMMP) and 1,1'-azobis(cyclohexanecarbonitrile) (ABCN). Non-limiting examples of organic peroxides include hydrogen peroxide, di-((tertiary)-butyl peroxide, benzoyl peroxide, and methyl ethyl ketone peroxide.

In some embodiments in accordance with the present invention, polymers comprising at least one norbornene-type repeating unit having at least one phenolic functionality and at least one maleic-anhydride-type repeating unit are polymers of Formula III, shown below:

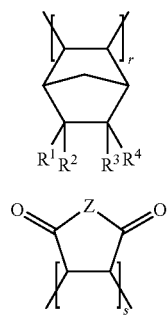

III where $R^1$ to $R^4$ are as previously defined for Formula I, with the proviso that at least one of $R^1$, $R^2$, $R^3$ and $R^4$ encompass at least one phenol moiety as defined above, Z is as previously defined for Formula II, and r and s represent the number of each repeating unit in polymer III. Some embodiments in accordance with the present invention are drawn to polymer compositions comprising a polymer, where such polymer encompasses at least one norbornene-type repeating unit having at least one phenolic functionality derived from at least one of the monomers in Monomer Group DD and at least one maleic anhydride-type repeating unit derived from at least one of the monomers of Formula II. In other embodiments of a polymer composition encompassing a single polymer, the polymer encompasses at least one norbornene-type repeating unit having at least one phenolic functionality derived from at least one of the monomers depicted in Monomer Group DD, at least one maleic anhydride-type repeating unit derived from at least one of the monomers of Formula II, and at least one norbornene-type repeating unit derived from at least one of the monomers depicted in one of Monomer Group CC and Monomer Group EE.

In some other embodiments in accordance with the present invention, polymers represented by Formula IV, that encompass two norbornene-type repeating units, IVa and IVc, and at least one maleic-anhydride-type repeating unit, IVb, as shown below:

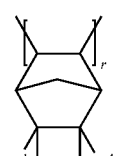

IVa

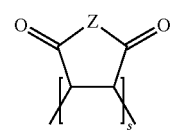

IVb

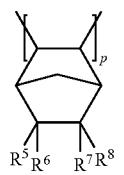

IVc where IVa and IVb are as defined for IIIa and IIIb, respectively, IVc is derived from any one of the monomers depicted in Monomer Group CC and r, s and p represent the number of each type of repeat unit in polymer IV.

Some embodiments in accordance with the present invention are drawn to polymer blend compositions, where such polymer blend compositions encompass a first polymer comprising at least one norbornene-type repeating unit having at least one phenolic functionality derived from at least one of the monomers in Monomer Group DD and at least one maleic anhydride-type repeating unit derived from at least one of the monomers of Formula II, and a second polymer. Furthermore, such polymer blend compositions can optionally further encompass at least one other polymer comprising at least one repeating unit derived from at least one monomer such as those defined in any of the previously described Monomer Groups, and/or of Formula I or Formula II.

In some embodiments in accordance with the present invention, the polymer blend compositions and the polymer compositions of the present disclosure further encompass at least one casting solvent and at least one Photo Active Compound (PAC). In other embodiments in accordance with the present disclosure, the polymer blend compositions and the polymer compositions further encompass at least one casting solvent and at least one Photo Acid Generator (PAG), in combination with at least one crosslinking additive.

Exemplary casting solvents include, but are not limited to, propylene glycol monomethyl ether (PGME), propylene glycol monomethyl ether acetate (PGMEA), ethyl lactate, methyl isobutyl carbinol (MIBC), gamma butyrolactone (GBL) and methyl n-amyl ketone (MAK) and mixtures thereof.

Exemplary PACs include, but are not limited to, PAC-5570 (St. Jean Photochemicals Inc., Quebec, Canada), SCL6 (Secant Chemicals Inc., Winchendon, Mass., USA), and TS-200, TS-250, TS-300 and 4NT-300 (all from Toyo Gosei Co. Ltd., Chiba, Japan), the structures of which are depicted below:

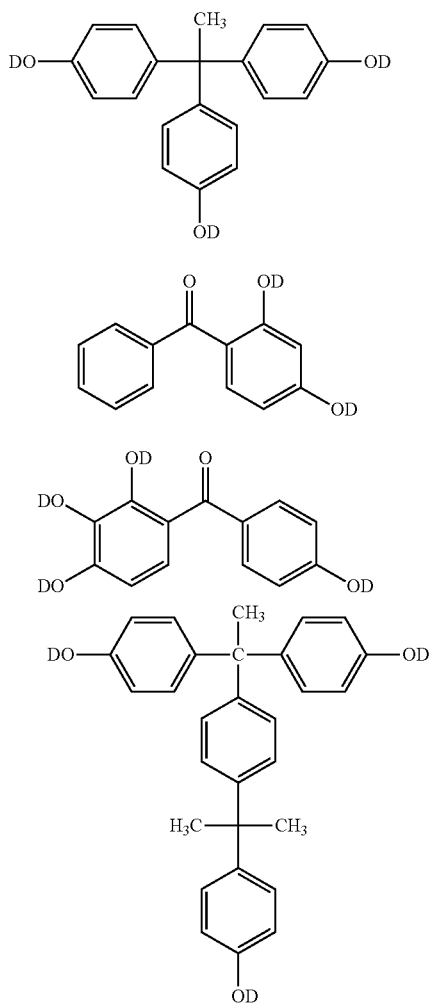

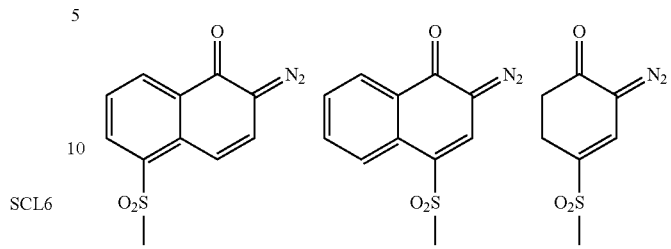

For TS-200, 67% of D is DNQ, For TS-250, 83% of D is DNQ, For TS-300, 100% of D is DNQ (where DNQ refers to diazonaphthoquinone) and where D=H or one of the below:

Exemplary PACs also include, but are not limited to, the PACs disclosed in U.S. Pat. No. 7,524,594 beginning at column 13, line 39 and continuing through Collective Formula 9z at column 20. Such portion of the '594 patent is incorporated herein by reference.

In some embodiments, as mentioned above, the polymer blend compositions and the polymer compositions of the present disclosure can also encompass at least one crosslinking additive, such as epoxies, glycolurils, and oxetanes, among others. More specifically, exemplary crosslinking additives include, but are not limited to, tetrakis(methoxymethyl) glycoluril (Powderlink 1174), and 3-methacryloxymethyl-3-ethyloxetane (OXMA), (4,4'-bis[3-ethyl-3 -oxetanyl) methoxymethyl]biphenyl) (OXBP), and bis[(3-ethyl-3-oxetanyl)methyl]isophthalate) (OXIPA) (all from UBE Industries, Ltd., Japan), a methylated melamine formaldehyde polymer under trade name Cymel 301 (CYTEC INDUSTRIES INC., WOODLAND PARK, N.J., USA), and generic structures for bisphenol A epoxy resin (LX-1 purchased from Daiso Chemical Co., Osaka, Japan), epoxy cyclohexylmethyl 3,4-epoxycyclo hexane carboxylate (CEL2021 [CAS# 2386-87-0] purchased from Diacel Chemical Industries, Osaka, Japan) and condensation products of 1-2-epoxy-4(2-oxiranyl)-cyclohexane of 2,2-bis(hydroxyl methyl)1-butanol/(3'-4'expoxycyclohexane)methyl 3'-4'expoxycyclohexyl-carboxylate mixture(EHPE3150 [CAS# 244772-00-7] purchased from Diacel Chemical Industries, Osaka, Japan) as shown below:

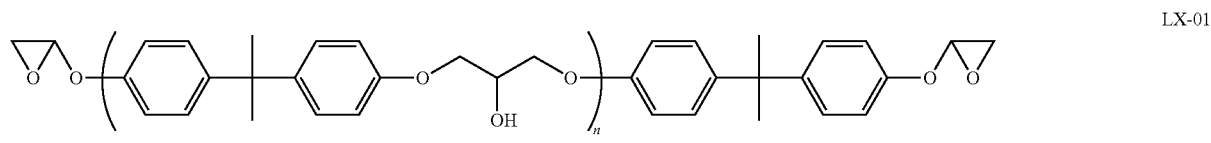

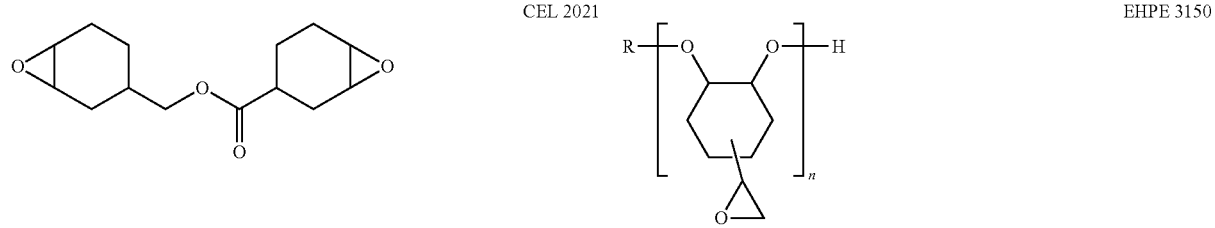

In some embodiments, the polymer blend compositions and the polymer compositions of the present disclosure encompass at least one thermal initiator and at least one crosslinking additive to provide thermally-induced crosslinking after image development.

In some embodiments, the polymer blend compositions and the polymer compositions of the present disclosure encompass at least one photo acid generator (PAG) and can optionally further encompass at least one photosensitizer. Exemplary PAGs include, but are not limited to, (p-isopropylphenyl)(p-methylphenyl)-iodonium tetrakis (pentafluorophenyl) borate (Rhodorsil 2074, Rhodia, Inc.) and TAG 382 (Toyo Ink), the structures of which are provided below:

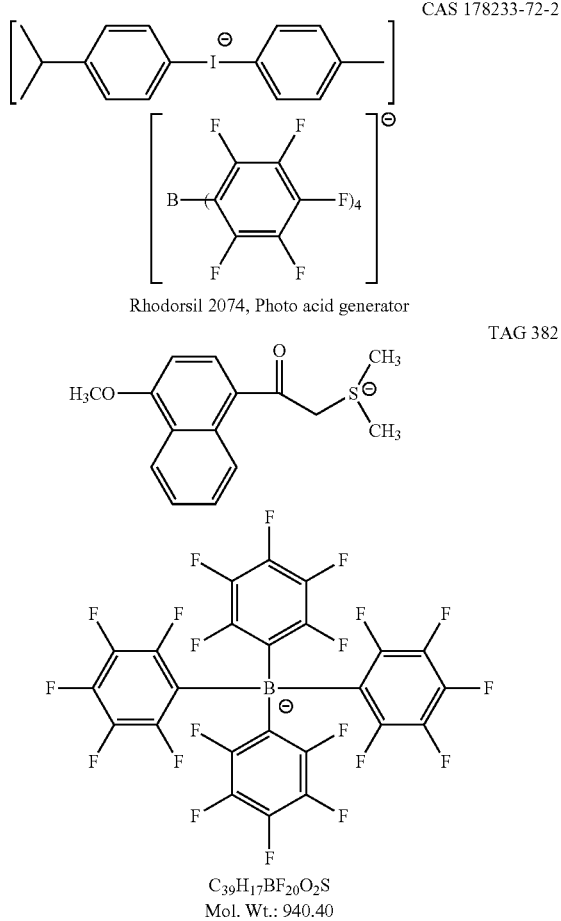

but also triphenylsulfonium salt PAGs, t-butyl substituted triphenylsulfonium salt PAGs, thio aromatic acyl substituted triphenylsulfonium salt PGAs, naphthalene substituted sulfonium salt PAGs, thianthrenium salt PAGs and bis sulfonium salt PAGs. Exemplary PAGs of each of the aforementioned families include, but are not limited to, triphenylsulfonium 1,1,1-trifluoro-N-[(trifluoromethyl)sulfonyl]methanesulfonamide (TPS N1). triphenylsulfonium tris[(trifluoromethyl)sulfonyl]methanide, triphenylsulfonium 4,4,5,5,6,6-hexafluorodihydro-4H-1,3,2-dithiazine 1,1,3,3-tetraoxide (TPS N3), triphenylsulfonium tris[(trifluoromethyl)sulfonyl]methanide (TPS C1); and tris(4-t-butylphenyl)sulfonium tetrakis(pentafluorophenyl)borate, tris(4-t-butylphenyl)sulfonium hexafluorophosphate, tris(4-t-butylphenyl)sulfonium hexafluoroantimonate, tris(4-t-butylphenyl)sulfonium nonafluorobutane sulfonate, tris(4-t-butylphenyl)sulfonium trifluoromethanesulfonate; and tris[4-[(4-acetylphenyl)thio]phenyl]sulfonium 1,1,1-trifluoro-N-[(trifluoromethyl)sulfonyl] methanesulfonamide, tris[4-[(4-acetylphenyl)thio]phenyl]sulfonium tris[(trifluoromethyl)sulfonyl]methanide (GSID26-1), tris[4-[(4-acetylphenyl)thio]phenyl]sulfonium 4,4,5,5,6,6-hexafluorodihydro-4H-1,3,2-dithiazine 1,1,3,3-tetraoxide, tris[4-[(4-acetylphenyl)thio]phenyl]sulfonium tris[(trifluoromethyl)sulfonyl]methanide; and (2-(4-methoxynaphthalen-1-yl)-2-oxoethyl)dimethylsulfonium tetrakis (pentafluorophenyl)borate (TAG 382), (2-(4-methoxynaphthalen-1-yl)-2-oxoethyl)dimethylsulfonium hexafluorophosphate, (2-(4-methoxynaphthalen-1-yl)-2-oxoethyl)dimethylsulfonium hexafluoroantimonate, (2-(4-methoxynaphthalen-1-yl)-2-oxoethyl)dimethylsulfonium nonafluorobutane sulfonate; and 5-phenyl-thianthrenium tetrakis(pentafluorophenyl)borate, 5-phenyl-thianthrenium hexafluorophosphate, 5-phenyl-thianthrenium hexafluoroantimonate, 5-phenyl-thianthrenium nonafluorobutane sulfonate, 5-phenyl-thianthrenium trifluoromethanesulfonate; and 1,4-phenylenebis[diphenylsulfonium]tetrakis (pentafluorophenyl)borate, 1,4-phenylenebis[diphenylsulfonium]hexafluorophosphate, 1,4-phenylenebis[diphenylsulfonium]hexafluoroantimonate, 1,4-phenylenebis[diphenylsulfonium]nonafluorobutane sulfonate, and 1,4-phenylenebis[diphenylsulfonium] trifluoromethanesulfonate.

PAGs generally absorb actinic radiation over a broad range of wavelengths, while in modern photoexposure tools, a limited range of wavelengths or even a single wavelength, is provided. Therefore, in addition to at least one PAG, at least one photosensitizer can be included in the polymer compositions of the present invention, where the at least one photosensitizer is selected to absorb at a wavelength(s) used for the image-wise exposure. While any appropriate photosensitizer(s) can be employed, a useful photosensitizer for exposure at wavelengths that include 248 nanometers includes CPTX, the structure, name and CAS number of which are shown below:

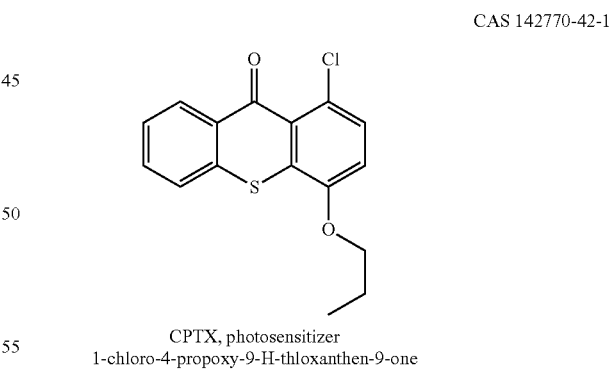

Additional photosensitizers include, among others, 9,10-dibutoxyanthracene, 9,10-diethoxyanthracene, anthracene-9-carboxylic acid and 1-chloro-4-propoxythioxanthone.

Some embodiments of the present invention are drawn to structures, such as microelectronic, such as semiconductor, and/or optoelectronic structures, which include at least one self-imageable layer formed from a film of a polymer composition. The polymer includes at least one norbornene-type repeating unit having at least one phenolic functionality derived from at least one monomer in Monomer Group DD and at least one maleic anhydride-type repeating unit derived from at least one monomer of Formula II. The polymer composition includes at least one casting solvent and at least one photo active compound or at least one photo acid generator in combination with at least one crosslinking additive.

The following examples, without being limiting in nature, illustrate methods for making monomers described herein, methods for polymerizing monomers described herein to form polymers having repeating units resulting from the monomers, and methods for using compositions comprising the polymers to form self-imageable films.

With regard to the compositions of the present invention, some embodiments provide for "positive tone" self-imageable films (photoresist compositions) and some provide for "negative tone" self-imageable films (photoresist compositions). Generally, negative tone photoresist compositions undergo a crosslinking reaction within those portions of the photoresist layer that are exposed to activating radiation. As a result, in a solution used to develop the relief image, the exposed portions become less soluble than unexposed portions. In contrast, for positive tone photoresist compositions, the exposed portions of the photoresist layer become more soluble in a developer solution than the portions unexposed to such radiation. In each case, the more soluble portions are washed away.

Due to that difference, as the following examples illustrate, at least one PAG in combination with at least one crosslinking additive may be added to a negative tone photoresist composition to increase the insolubility of the exposed portions of the resulting film or layer. In contrast, at least one PAC may be added to a positive tone photoresist composition. When a portion of the film (or layer) of the photoresist composition is exposed to appropriate activating radiation, the at least one PAC generates a carboxylic acid which enhances the solubility of the exposed portion in an aqueous alkali solution as compared to any unexposed portion(s) of the film (or layer).

In the presentation of the following experimental data, abbreviations are used to simplify the naming of monomers and catalysts. The following listing of abbreviations coordinates each abbreviation with an appropriate name. Furthermore, it will be noted that the experimental data provided does not limit the scope of the embodiments of the present invention. Rather, such data merely illustrate the preparation of monomers useful for forming the illustrative polymers and composition embodiments in accordance with the present invention as well as for demonstrating the usefulness of such embodiments.

Monomers

| | |
|---|---|
| NBPhOAc | 4-(bicyclo[2.2.1]hept-5-en-2-yl)phenyl acetate |
| NBMMPA | 4-(bicyclo[2.2.1]hept-5-en-2-ylmethyl)-2-methoxyphenyl acetate |
| NBMMPhOH | 4-(bicyclo[2.2.1]hept-5-en-2-ylmethyl)-2-methoxyphenol |
| NBPhOH | 4-(bicyclo[2.2.1]hept-5-en-2-yl)phenol |
| NBMCOPhOAc | 4-(2-(bicyclo[2.2.1]hept-5-en-2-yl)acetyl)phenyl acetate |
| NBMCOPhOH | 4-(2-(bicyclo[2.2.1]hept-5-en-2-yl)acetyl)phenol |
| PENB | 5-phenethylbicyclo[2.2.1]hept-2-ene |
| PhNB | 5-phenylbicyclo[2.2.1]hept-2-ene |
| DecNB | 5-decylbicyclo[2.2.1]hept-2-ene |
| NBTON | 5-((2-(2-methoxyethoxy)ethoxy)methyl)bicyclo[2.2.1]hept-2-ene |
| MAH | maleic anhydride |

A. Monomer Synthesis

Example A1

Synthesis of NBPhOAc

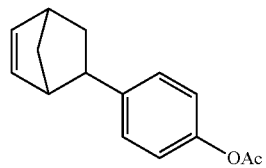 [SMILES: CC(=O)Oc1ccc(C2CC3C=CC2C3)cc1]

An appropriately sized and equipped reaction vessel was charged with 1750 g dicyclopentadiene, 2147 g p-acetoxystyrene, and 64 g phenothiazine. Stirring was started and then the reactor was evacuated of air and pressurized to 5 psig with nitrogen. Heating to 160° C. was commenced and the reactor held at 160° C. for 6 hours. The reactor was then cooled to ambient temperature, the reaction mixture removed from the reactor and distilled (110-120 mtorr, pot temperature 113-114° C.) to give 1227 g of 99% pure (GC) NBPhOAc.

Example A2

Synthesis of NBMMPA

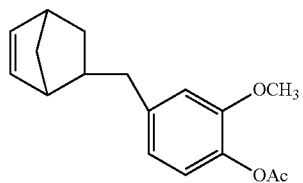 [SMILES: COc1cc(CC2CC3C=CC2C3)ccc1OC(C)=O]

An appropriately sized and equipped reaction vessel was charged with 900 g (6.8 mol) dicyclopentadiene and 11.2 kg (~98% pure, 54.5 mol) eugenyl acetate. Stirring was then started and, while stirring, flushed three times with nitrogen. The reaction was brought to 200° C. over a period of 3 hr, while the pressure was allowed to rise to 23 psig. Once at temperature, the reaction mixture was stirred for 6 hours at 200° C., during which time the pressure ranged from 12-23 psi. The reaction was then allowed to cool to room temperature overnight. GC analysis indicated that the product mixture contained 72.6% eugenyl acetate, 0.1% DCPD, 25.8% NBM-MPA, and 0.2% 4-NBCH$_2$C$_6$H$_3$-2-OMe,4-OH. Total weight recovered from the reactor was about 12 Kg.

The recovered material was distilled under high vacuum through a 6-inch Vigreaux column and distillation head to remove the bulk of the excess eugenyl acetate. After removal of 580.3 g of eugenyl acetate, the 6-inch Vigereaux column was removed, and the distillation head was connected directly. A total 8855.5 g of eugenyl acetate was recovered.

About 2.1 Kg of the pot residue was further distilled under high vacuum and about 0.85 kg of NBMMPA, with an assay of greater than 90 area % by GC, was obtained. This material was then acetylated with 0.6 kg acetic anhydride and 0.4 kg tetrahydrofuran in an agitated glass flask where the flask was heated to 81° C. and held for 7 hours at this temperature. This reaction mixture was distilled, and 0.15 kg of NBMMPA was recovered with purity greater than 97 area % by GC.

Example A3

Synthesis of NBPhOH

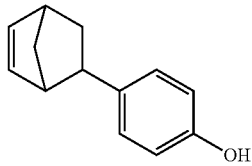 [SMILES: Oc1ccc(C2CC3C=CC2C3)cc1]

100 g NBPhOAc and 150 g THF were charged to an appropriately sized and equipped reaction vessel and the reaction mixture heated to 60° C., with stirring, under a nitrogen blanket pressurized to 5 psig. 263 g of 20% aqueous sodium hydroxide was then added dropwise over the course of one hour and the reaction mixture stirred at temperature for an additional 4 hours, after which the solution was acidified by the dropwise addition of 131 g of acetic acid. The mixture was then allowed to cool, transferred to a separatory funnel, diluted with 200 mL of ethyl acetate and subsequently washed with 200 mL of water five times. The solvents were then removed by rotoevaporation. The resulting crystals were washed with 100 g of hexanes and then recrystallized from 400 mL of a 1:1 toluene:hexane solution. The yield was 44.8 g (55.1%) of NBPhOAc.

Example A4

Synthesis of NBMMPhOH

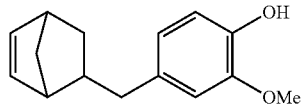 [SMILES: COc1cc(CC2CC3C=CC2C3)ccc1O]

50 g NBMMPA and 50 g THF were charged to an appropriately sized and equipped reaction vessel and heated, with stirring, to 70° C. Then, 310 g of 10% aqueous potassium hydroxide was then added over the course of an hour and the mixture was then allowed to react for an additional 2 hours, after which it was acidified by the dropwise addition of 33 g of acetic acid. The mixture was then allowed to cool, transferred to a separatory funnel, diluted with 50 mL of ethyl acetate and subsequently washed with 200 mL of water three times. The solvents were then removed by rotoevaporation. The resulting liquid was purified by silica gel column chromatography. The solvents were removed by rotoevaporation and a white solid was obtained. The yield was 31.0 g (62%) of NBMMPhOH.

Example A5

Synthesis of NBMCOPhOAc

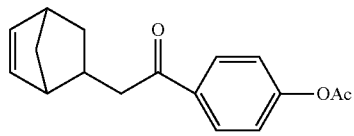 [SMILES: CC(=O)Oc1ccc(C(=O)CC2CC3C=CC2C3)cc1]

An appropriately sized and equipped reaction vessel was charged with LiBr (237.7 g, 2.74 mol) in 700 mL of tetrahydrofuran (THF, anhydrous) to give a clear solution. Then, 122.6 g of CuCN (1.37 mol) and 1.5 L of THF (anhydrous) were added and the reaction mixture cooled to −20° C. with stirring. An addition funnel was charged with $NBCH_2ZnBr$ (1574.1 mL, 1.3 mol, 21.0wt % in THF) and added to the reaction mixture slowly over 45 minutes. During the addition the temperature varied between −20 and −40° C. A dark greenish brown solution resulted and the reaction mixture warmed to 0° C. over 2 h. The reaction mixture was again cooled to −25° C. and the 4-acetoxy benzoyl chloride (236.4 g, 1.19 mol) was added neat via cannula and rinsed in with 200 mL of THF over 20 minutes at −25° C. to −5° C. giving a greenish brown slurry. Then, the reaction mixture was allowed to warm to room temperature slowly and then stirred at room temperature for an additional 2 h. An aliquot was quenched with (9:1) saturated $NH_4Cl$: $NH_4OH$ (conc.) and extracted with methyl cert-butyl ether (MTBE). LCMS analysis indicated 87.6% product with 4.62% norbornane byproduct indicating that the reaction was complete. 4 L (9:1) of saturated $NH_4Cl$: $NH_4OH$ (conc.) was added to the reaction mixture and upon dilution with 6 L MTBE a gray precipitate was observed. The precipitate was filtered, the phases were separated and the aqueous phase extracted with (2×2 L) MTBE. The combined organic layers were washed with (2×2 L) saturated $NH_4Cl$: $NH_4OH$(conc.) (9:1) followed by (3×2 L) brine and dried over sodium sulfate, filtered, and rotary evaporated, and further dried under high vacuum at 65° C. bath temperature to give 264.3 g crude product as a light yellow paste.

The crude product was dissolved in 500 mL $CH_2Cl_2$ and adsorbed onto 265 g of silica gel. The $CH_2Cl_2$ was removed under high vacuum and the crude product was chromatographed over 2.5 kg of silica gel eluting with heptane (20 L), 1% ethyl acetate (EtOAc) in heptane (20 L), 2% EtOAc in heptane (20 L). 3% EtOAc in pentane (5 L), 4% EtOAc in pentane (8 L). 5% EtOAc in pentane (8 L), 6% EtOAc in pentane (4 L), 7% EtOAc in pentane (8 L), 8% EtOAc in pentane (8 L), 9% EtOAc in heptane (8 L), 10% EtOAc in heptane (4 L). The concentrated purified fractions yielded 213.8 g (66.4%) of product as clear viscous oil with 98.08% purity by GC.

Example A6

Synthesis of NBMCOPhOH

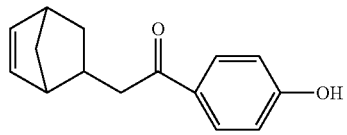 [SMILES: O=C(CC1CC2C=CC1C2)c1ccc(O)cc1]

7 g NBCH2COPhOAc, 30 mL of methanol and 1 g of Amberlyst-15 were charged to an appropriately sized and equipped reaction vessel. This mixture was heated, with stirring to 40° C. for 24 hours in a nitrogen atmosphere. The resulting solution was filtered using 1 micron nylon filter after diluting the reaction mixture with 15 mL tetrahydrofuran. The filtrate was concentrated to yield 6 g of the resulting monomer in 95% yield. 1H-NMR and FT-IR data were consistent with the desired structure.

B. Polymer Synthesis Examples.

Measurements of Dissolution Rates (DR) were made as follows: In the clean room, polymer solutions (typically 20% by weight polymer in PGMEA) were spin coated onto 4 inch thermal oxide coated wafers at 500 rpm for 10 seconds, followed by a ramp to 2000 rpm for 60 seconds. The wafer was then soft baked at 100° C. for 60 seconds. The dissolution rate of the film in 0.26N tetramethylammonium hydroxide was measured by an interferometric method using a Thickness Detection Solutions DRM 420-L dissolution rate monitor and is, effectively, the difference in film thickness divided by the time required to achieve that difference.

Examples B1, B2 and B3

Polymerization of NBPhOH with MAH and NBMMPhOH with MAH

For each of Examples B1, B2 and B3, an appropriately sized and equipped reaction vessel was changed with the monomers, AIBN initiator and solvent. The reaction vessel was sealed and the mixture sparged with nitrogen for 30 min. Then the mixture was then heated, with stirring, to 70° C. and held at that temperature for 24 h. After cooling, the reaction mixture was poured into hexanes (500 mL) to precipitate the polymer. The polymer solids were collected and dried overnight in a vacuum oven at 70° C. The monomers and AIBN initiator added, as well as their amounts in millimoles (mmol), the amount of solvent added in grams (g), the % yield of polymer and Mw are reported in Table 1 for each of B1-B3.

TABLE 1

| Ex # | NBPhOH | NBMMPhOH | MAH | AIBN | THF | Mw | Yield |
|---|---|---|---|---|---|---|---|
| B1 | 83.7 | — | 83.7 | 5.03 | 17.8 | 3030 | 60% |
| B2 | — | 15 | 15 | 1.52 | 25.2 | 1440 | 51% |
| B3 | — | 100 | 100 | 10.0 | 21.9 | 2270 | 17% |

Examples B4 through B7

Polymerization of NBPhOH and MAH with NBTON and DecNB

For each of Examples B4, B5, B6 and B7 an appropriately sized and equipped reaction vessel was charged with the indicated amounts of monomers, AIBN initiator and solvent shown in Table 2. below. The reaction vessel was sealed and the reaction mixture was sparged with nitrogen for 30 min. The mixture was then heated with stirring at 65° C. for 24 h. After cooling, the solution was poured into excess hexanes (about 10 to 50 times in volume of polymer solution) in order to precipitate the polymer. For Examples B6 and B7, the precipitate polymer solids were dissolved in THF (enough to make a 30 wt % polymer solution) and the precipitation procedure with excess hexane was repeated two more times. All polymers were filtered and dried overnight in a vacuum oven at 80° C. The molecular weights (Mw) and dissolution rates (DR) of each polymers in aqueous alkali developer (0.26N TMAH) was determined. For each example, Table 2 reports the amounts of each monomer and the initiator in millimoles (mmol) and the solvent in grams (g). DR is reported in nanometers per sec (nm/sec) and yield as percent yield based on the total amount of monomer(s) charged.

The data of Table 2 indicates that the addition of a third, non-phenolic repeating unit to a NBPhOH/MAH polymer (B4) reduces the dissolution rate and increases the polymer yield. In each case, the nature of the third NB-type repeating unit seems a larger factor than the amount of the third monomer added during the polymerization. Thus it can be seen that the addition of 10 mol % DecNB (B5) to the base polymer (B4) has a larger effect on DR than does the addition of 10 mol % NBTON (B7). Not wishing to be bound by theory it is believed that this result is due to the more polar NBTON repeating unit, as compared to the DecNB repeating unit, reducing the aqueous base solubility of the B7 polymer less than the DecNB repeating unit's reduction of the aqueous base solubility of polymer B5.

TABLE 2

| Ex. # | NBPhOH | NBTON | DecNB | MAH | AIBN | Ethyl acetate | Mw | DR | Yield |
|---|---|---|---|---|---|---|---|---|---|
| B4 | 9.75 | — | — | 9.75 | 0.65 | 1.83 | 3100 | 200 | 25% |
| B5 | 26.4 | — | 6.61 | 33.1 | 2.21 | 6.35 | 3800 | 0 | 33% |
| B6 | 56.1 | 14.1 | — | 70.1 | 9.33 | 12.6 | 3000 | 20 | 51% |
| B7 | 63.1 | 7.0 | — | 70.1 | 9.33 | 12.5 | 3000 | 28 | 49% |

Examples B8 and B9

Polymerization of NBPhOH and MAH

For each of B8 and B9 the monomers, AMMP initiator and solvent were charged to an appropriately sized and equipped reaction vessel. For B8, 1.86 g (10 mmol) of NBPhOH, 0.98 g (10 mmol) of MAH, 0.15 g (0.67 mmol) of AMMP and 2.68 g of ethyl acetate were charged; and for B9, 2.33 g (12.5 mmol) of NBPhOH, 1.23 g (12.5 mmol) of MAH, 0.29 g (1.25 mmol) of AMMP and 3.27 g of ethyl acetate were charged. After charging, each reaction vessel was sealed and the reaction vessel sparged with nitrogen for 30 min. Each mixture was then heated with stirring to 70 CC and held at that temperature for 24 h. For B8 a 42% conversion to a polymer with a $M_w$ of 3100 was obtained. For B9 a 68% conversion to a polymer with a $M_w$ of 1600 was obtained. Thus while the increase in the ratio of initiator to monomers in B9 as compared to B8, resulted in a significant increase in the conversion to polymer, the $M_w$ of the B9 polymer was about one-half the $M_w$ of the B8 polymer.

Example B10

Polymerization of NBPhOH and MAH with Batch Addition of the Initiator

To an appropriately sized and equipped reaction vessel, 14 g (75 mmol) of NBPhOH, 7.35 g (75 mmol) of MAH and 21 g of ethyl acetate were charged. After sparging the mixture with nitrogen for 30 minutes, the reaction mixture was heated to 80° C. with stirring. Portions of the AMMP initiator (0.34 g, 1.48 mmol) were added in five batches over a 25 hour period (AMMP addition schedule: 0 hours, 16 hours, 19 hours, 22 hours, 25 hours). The total amount of initiator added to the reaction mixture then being 1.70 g; 7.40 mmol. The conversion to a polymer having a $M_w$ of 2800 was 68% as determined from an aliquot removed from the reaction vessel after the last initiator addition. As can be seen, the conversion to polymer of B10 is comparable to that of B9 while the $M_w$ obtained was comparable to B8.

Examples B11

Polymerization of NBPhOH and MAH with Batch Addition of the Initiator

The polymerization of Example B10 was repeated except that six portions of the AMMP initiator were added to the reaction mixture over 41 hour period (0 hrs, 16 hrs, 19 hrs, 22 hrs, 25 hrs, 41 hrs). The total amount of initiator added to the reaction mixture then being 2.04 g; 8.88 mmol. After the initiator addition was completed, the reaction mixture was heated and stirred for a further 6 hours. After cooling, the reaction mixture was poured into excess hexanes in order to precipitate the polymer followed by collection of the solids. After repeating this precipitation procedure twice, the combined polymer solids were dried for 20 hours in a vacuum oven at 80° C. to yield 10 g (47% yield) of a dry powder. The $M_w$ for the final product, by GPC analysis, was 3000.

Examples B12 and B13

Polymerization of PhNB and MAH and PENB and MAH, Respectively

The amounts of monomers, AIBN initiator and solvent indicated in Table 3 were charged to an appropriately sized and equipped reaction vessel. The vessel was sealed and the mixture sparged with nitrogen for 30 min. The mixture was then heated, with stirring, to 70° C. and held at that temperature for between 20 to 24 h. Aliquots were removed from the reaction vessels to determine the $M_w$ and percent conversion of the monomers to polymer. As seen from the data in Table 3, the ethylene spaced phenyl substituted NB (PENB) resulted in a polymer having both a higher Mw and % conversion. For each example, Table 3 reports the amounts of each monomer and the initiator in millimoles (mmol) and the solvent in grams (g). Conversion is reported as a percentage based on the total amount of monomer(s) charged to the reaction vessel.

TABLE 3

| Ex. # | PhNB | PENB | MAH | AIBN | Ethyl Acetate | $M_w$ | Conversion |
|---|---|---|---|---|---|---|---|
| B12 | 10.0 | — | 10.0 | 0.667 | 2.57 | 3500 | 52% |
| B13 | — | 12.5 | 12.5 | 0.833 | 3.56 | 6650 | 80% |

Examples B14, B15 and B16

Polymerization of NBMCOPhOH with MAH and with PENB as a Third Repeat Unit

The amounts of monomers (NBMCOPhOH, PENB, MAH), AMMP initiator and solvent indicated in Table 4 were charged to an appropriately sized and equipped reaction vessel. The reaction vessel was sealed and the reaction mixture sparged with nitrogen for 30 min. The mixture was then heated, with stirring, to 70° C. and held at that temperature for 20 h. After cooling, the solution was poured into excess hexanes in order to precipitate the polymer followed by collection of the solids. The polymer was filtered and dried for 20 hours in a vacuum oven at 70-80° C. $^1$H-NMR spectroscopy was used to determine the composition of the Example B16 polymer to be NBPhOH/PENB/MA in a molar ratio of 42/8/50. The dissolution rates (DR) of the polymers in aqueous alkali developer (0.26N TMAH) were determined. As can be seen, the yield and $M_w$s of the three polymers are similar, however the addition of 8 mol % PENB was effective in reducing the DR dramatically as compared to the polymers of B14 and B15. It can also be seen that the DRs of polymers B14 and B15 are much higher than any of the other polymers reported herein. Without wishing to be bound by theory, it is believed that the acetyl group that bridges the phenol to the norbornene-type group serves to provide activation to the phenolic hydrogen, thus increasing its acidity.

TABLE 4

| Ex # | NBMCOPhOH NBPhOH | PENB NBTON | MAH | AIBN | AMMP | Ethyl Acetate | Mw | DR | Yield |
|---|---|---|---|---|---|---|---|---|---|
| B14 | 7.50 | | 7.50 | 0.50 | — | 2.36 | 5350 | 1253 | 65% |
| B15 | 7.50 | | 7.50 | — | 0.50 | 2.33 | 5950 | 1652 | 69% |
| B16 | 6.75 | 0.75 | 7.50 | — | 0.50 | 2.31 | 5450 | 301 | 66% |

C. Imaging Examples

The following non-limiting examples illustrate imaging using composition embodiments in accordance with the present invention, as well as a comparative, previously known composition, poly(para-hydroxystyrene) (PHS).

The spin protocol used in the below imaging examples fell into one of the following four categories: (A) 500 rpm/10 sec and 2000 rpm/60 sec; (B) 300 rpm/3 sec and 800 rpm/20 sec; (C) 300 rpm/3 sec and 600 rpm/20 sec; (D) 300 rpm/3 sec and 2000 rpm/20 sec; (E) 500 rpm/10 sec and 1000 rpm/30 sec; and (F) 500 rpm/30-40 sec.

Each of the imaging examples included a post apply bake (PAB) step, which occurred either at a temperature of 130° C. for a period of 2 minutes ("A" procedure); at a temperature of 110° C. for a period of 100 seconds ("B" procedure); or 100° C. for a period of 1 minute ("C" procedure).

Developing may be accomplished in a variety of ways including dip and puddle. When puddle develop was employed, the film was covered by a puddle of developer for various times (t) and then rinsed ("A/t sec" procedure). When dip develop was employed, the substrate holding the film was immersed in developer for either 90 seconds ("B" procedure) or 30 seconds ("C" procedure) after which the substrates and films were rinsed.

When presenting the evaluations of the imaging performed for Examples C1 through C8 in Table 4, the polymer was dissolved in PGMEA and applied to a wafer using one of the aforementioned spin protocols, followed by one of the three PAB procedures and after exposure, one of the three develop procedures. Each of these procedures called out using the identifying codes for each, as listed above. Additionally the amount of polymer, PGMEA, PAC, PAG and cross-linker (CL) is reported in grams (g), exposure dose (EXD) reported in mJ/cm$^2$ where such is reflective of both the energy of a broad band Hg-vapor light source used to expose the sample and the time of that exposure; and post exposure bake (PEB) reported in ° C./sec reflects the total time at the indicated temperature. Still further, where a PAC was employed, TrisP-2 3M6C-2-201 was used; where a PAG was employed equal amounts of both TAG-382 and the cross-linker (CL) Powderlink1174 were used.

Example C1-C8

Imaging

The actual amounts used to form the polymer compositions used for Imaging Examples C1-C8, as well as the visual evaluation of such images, is summarized in Table 5, below.

For C1, the polymer in example B1 and TrisP-2 3M6C-2-201 were used to form a positive tone polymer composition. After the post apply bake (PAB), the film thickness was 6.78 um and, after development in 0.26N TMAH, the film thickness in the unexposed areas was 6.70 um.

For C2 the polymer in example B2, TAG-382 and Powderlink1174 were used to form a negative tone polymer composition. After PAB, the film thickness was 0.94 um and, after development in 0.26N TMAH, the film thickness in the exposed areas was 0.87 um.

For C3, the polymer in example B3 and TrisP-2 3M6C-2-201 were used to form a positive tone polymer composition. After PAB, the film thickness was 1.49 um and, after development in 0.26N TMAH, the film thickness in the unexposed areas was 1.45 um.

C4 is a comparative example prepared using previously known poly(para-hydroxystyrene) (Mw=10,800, Mw/Mn=1.89, Aldrich) and TrisP-2 3M6C-2-201 to form a positive tone polymer composition. After PAB, the film thickness was 1.41 um and, after development in 0.26N TMAH, the film thickness in the unexposed areas was 1.17 um.

For C5, the polymer in example B11, TAG-382 and Powderlink1174 were used to form a negative tone polymer composition. After PAB, the film thickness was 2.49 um and, after development in 0.26N TMAH, the film thickness in the exposed areas was also 2.49 um.

For C6, the polymer in example B15, TAG-382 and Powderlink 1174 were used to form a negative tone polymer composition. After PAB, the film thickness was 2.31 um and, after development in 0.26N TMAH, the film thickness in the exposed areas was 2.19 um.

For C7, the polymer in example B6, TAG-382 and Powderlink1174 were used to form a negative tone polymer composition. After PAB, the film thickness was 3.41 um and, after development in 0.26N TMAH, the film thickness in the exposed areas was also 2.87 um.

For C8, the polymer in example B7, TAG-382 and Powderlink1174 were used to form a negative tone polymer composition. After PAB, the film thickness was 2.51 um and, after development in 0.26N TMAH, the film thickness in the exposed areas was also 2.49 um.

TABLE 5

| Ex. | Polymer | PGMEA | PAC | PAG | CL | SP | PAB | EXD | PEB | Dev | Resolution |
|---|---|---|---|---|---|---|---|---|---|---|---|
| C1 | 1.1 | 0.76 | 0.23 | — | — | A | A | 70 | — | A/30 | 5 um vias on 15 um pitch |
| C2 | 1.0 | 3.0 | — | 0.1 | 0.1 | B | B | 135 | 110/120 | B | 5 um LS open |
| C3 | 1.5 | 4.5 | 0.38 | — | — | C | B | 130 | — | C | 5 um open |
| C4 | 2.0 | 8.0 | 0.50 | — | — | D | B | 65 | — | D | 5 um not open |
| C5 | 7.6 | 32.4 | — | 0.76 | 0.76 | F | C | 976 | 120/120 | A/185 | 5 um open |
| C6 | 1.0 | 1.0 | — | 0.10 | 0.10 | F | C | 976 | 120/120 | A/10 | 5 um open |
| C7 | 2.5 | 7.5 | — | 0.25 | 0.25 | E | C | 710 | 120/120 | A/180 | 5 um open |
| C8 | 1.2 | 3.6 | — | 0.12 | 0.12 | E | C | 976 | 120/120 | A/210 | 10 um open |

Dielectric Constant

The dielectric constant of the polymer from Example B1 and the PHS control were both measured.

Examples B1a and B1b

For the polymer from Example B1, two polymer compositions, B1a and B1b, were prepared by dissolving the first polymer sample in PGMEA (400% on the polymer) along with TrisP 3M6C-2-201 (25% on the polymer, from. Toyo Gosei) and with CEL2021 (20% on the polymer); and the second polymer sample in PGMEA (400% on the polymer) along with TrisP 3M6C-2-201 (25% on the polymer, from Toyo Gosei) and with Techmore VG3101L-Mitsui Chemical Inc. (20% on the polymer). Each of the two compositions was then spun onto an aluminum plate (200 um thickness, 100 mm×100 mm) at 300 rpm for 3 sec and 800 rpm for 20 sec, soft baked at 110° C. for 100 sec to give a polymer film of about 3 microns. The film was then exposed at 500 mJ/cm2 using a mask aligner having a broad band Hg vapor light source. After exposure, the wafer was post-exposure baked at 220° C. for 60 min under nitrogen atmosphere to obtain a cured film.

Comparative Examples PHS1a and PHS1b

For PHS (Mw=10,800, Mw/Mn=1.89, Aldrich), two polymer compositions, PHS1a and PHS1b, were prepared by dissolving the first PHS sample in PGMEA (500% on the polymer) along with TrisP 3M6C-2-201 (25% on the polymer, from Toyo Gosei) and with CEL2021 (20% on the polymer); and the second PHS sample in PGMEA (500% on the polymer) along with TrisP 3M6C-2-201 (25% on the polymer, from Toyo Gosei) and with Techmore VG3101L-Mitsui Chemical Inc. (20% on the polymer). Each of the two compositions were spun onto an aluminum plate (200 um thickness. 100 mm×100 mm) at 300 rpm for 3 sec and 800 rpm for 20 sec, soft baked at 110° C. for 100 sec to give a polymer film of about 3 microns, then exposed at 500 mJ/cm2 using a mask aligner having a broad band Hg vapor light source (g, h and i bands). After exposure, the wafer was post-exposure baked at 220° C. for 60 min under nitrogen atmosphere to obtain a cured film.

The dielectric constant of each of four films was measured following the technique of JIS-K6911, a Japanese Industrial Standard. The film thickness was measured by using Dainippon Screen MFG CO., LTD. Lambda ace VM-1020. The data from these measurements being provided in Table 6, below.

TABLE 6

| Example # | Dielectric Constant | | | | tan δ | | | |
|---|---|---|---|---|---|---|---|---|
| | 1 kHz | 10 kHz | 100 kHz | 1 MHz | 1 kHz | 10 kHz | 100 kHz | 1 MHz |
| B1a | 4.4 | 4.2 | 4.0 | 3.8 | 0.022 | 0.028 | 0.039 | 0.047 |
| B1b | 4.6 | 4.4 | 4.3 | 4.0 | 0.081 | 0.031 | 0.035 | 0.044 |
| PHS1a | 4.9 | 4.7 | 4.6 | 4.3 | 0.015 | 0.020 | 0.037 | 0.059 |
| PHS1b | 4.9 | 4.7 | 4.6 | 4.2 | 0.014 | 0.018 | 0.041 | 0.084 |

By now it should be realized that the polymer composition embodiments in accordance with the present invention encompass both positive and negative tone compositions that can form films with a dielectric constant lower than that of a PHS polymer film and that are readily imaged to provide features of 5 microns or less. Such polymer compositions encompassing both norbornene-type repeating units and maleic acid-type repeating units that can be formed having a generally wide range of molecular weights, dissolution rates and very film losses for both the positive and negative tone films during development with 0.26N TMAH solutions.

What is claimed is:
1. A polymer composition for forming a film comprising:
   a polymer comprising a first repeating unit represented by the Formula IIIb:

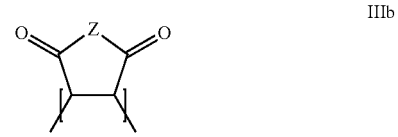

where Z is O or $NR^S$, where $R^5$ is hydrogen or R*—OH, where R* is an alkyl, aryl, or alkaryl linking group,
   and a phenol-functional norbornene second repeating unit derived from a phenol-functional monomer selected from the group of norbornene compounds consisting of:

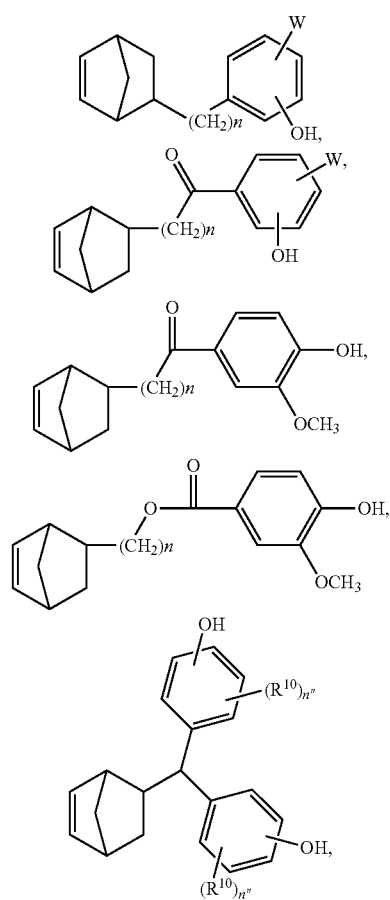

-continued

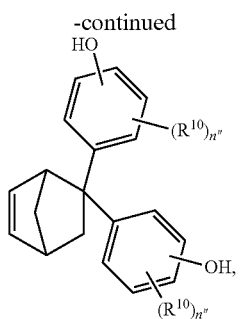

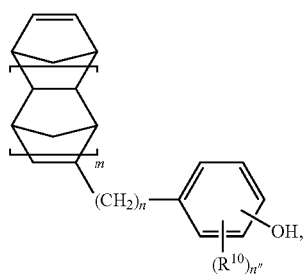

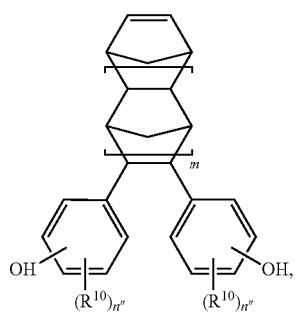

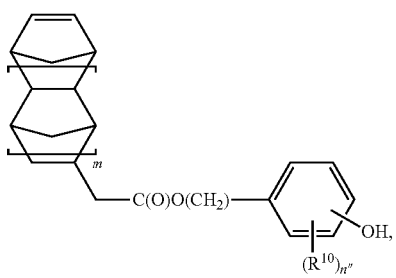

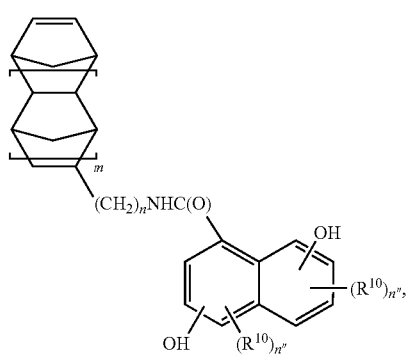

-continued

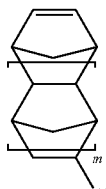

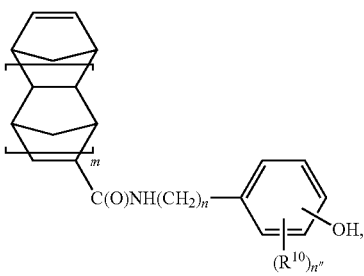

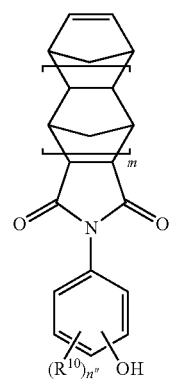

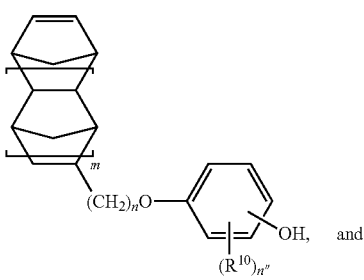

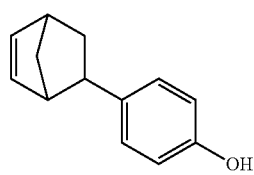

where n is an integer from 1 to 5, W is H or alkyl or alkoxy; each $R^{10}$ is independently selected from H, a halogen, a monovalent hydrocarbon, an alkoxy, an aryloxy, or an electron withdrawing group; m is an integer from 0 to 5; and each n" is independently an integer from 0 to 4;

said polymer being produced by reaction of said phenol functional norbornene monomer with a monomer represented by Formula II:

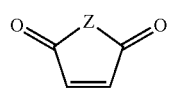
II where Z is defined as above, the reaction being characterized in that the amount of first repeating units represented by the Formula IIIb in the polymer is substantially equivalent to the amount of the monomer of the Formula II incorporated into the polymer;
a casting solvent; and
(i) a diazo-quinone functional photo active compound or
(ii) a photo acid generator in combination with one or more crosslinking additives.

2. The polymer composition of claim 1 wherein the polymer is prepared by way of free radical polymerization.

3. The polymer composition of claim 1, wherein the first repeating unit represented by the Formula Mb is derived from maleic anhydride and the phenol-functional norbornene second repeating unit is derived from a monomer selected from the group consisting of:

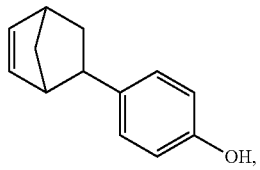

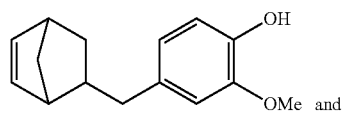

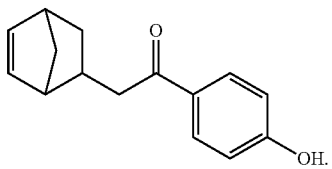

4. The polymer composition of claim 3, wherein the first repeating unit represented by the Formula IIIb is derived from maleic anhydride and the phenol-functional norbornene second repeating unit is derived from:

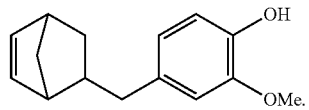

5. The polymer composition of claim 3, where the first repeating unit represented by the Formula Mb is derived from maleic anhydride and the phenol-functional norbornene second repeating unit is derived from:

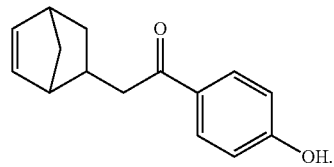

6. The polymer composition of claim 3, where the first repeating unit represented by the Formula Mb is derived from maleic anhydride and the phenol-functional norbornene second repeating unit is derived from:

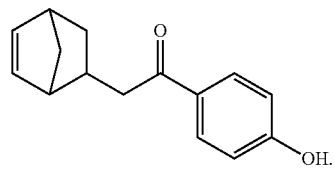

7. The polymer composition of claim 1, wherein the diazo-quinone functional photo active compound is present.

8. The polymer composition of claim 7, wherein the diazo-quinone functional photo active compound is selected from the group consisting of:

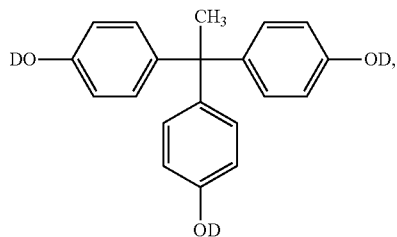

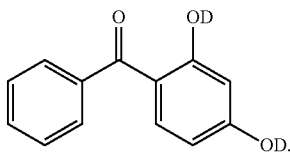

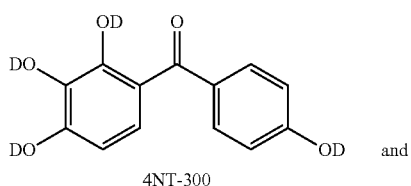

4NT-300

-continued

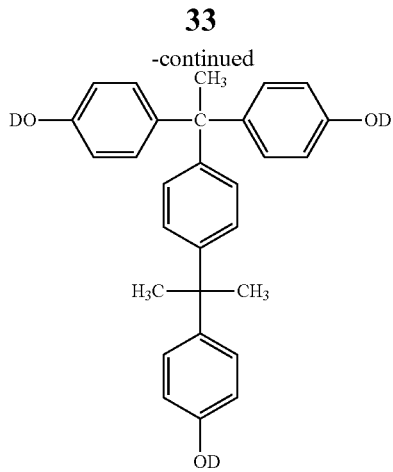

where at least one D=a diazo-quinone functional moiety and the remainder of D=H.

9. The polymer composition of claim 8, wherein the diazo-quinone functional moiety is selected from the group consisting of:

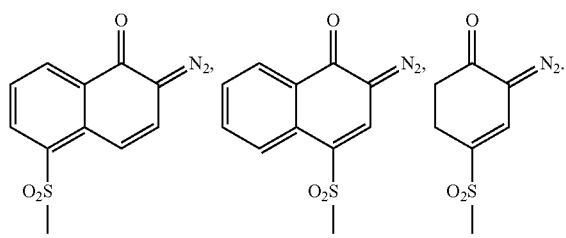

10. A method of forming a microelectronic or optoelectronic structure, comprising:
    coating a microelectronic or optoelectronic substrate with the polymer composition of claim 7 to form a film;
    image wise exposing the film to actinic radiation;
    treating the exposed film with an aqueous base developer to form an imaged film; and
    curing the imaged film to form a microelectronic or optoelectronic structure.

11. The polymer composition of claim 1, wherein the photo acid generator and one or more crosslinking additives are present.

12. The polymer composition of claim 11, where the photo acid generator is selected from; an

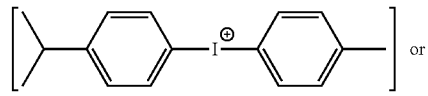

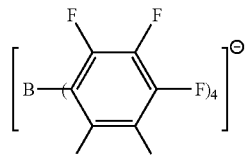

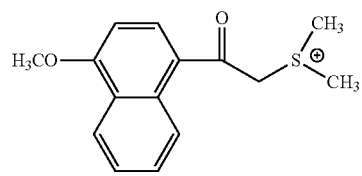

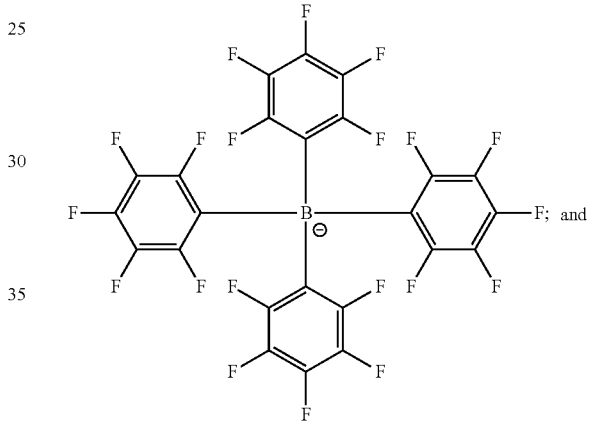

where the one or more crosslinking additives are selected from tetrakis(methoxymethyl) glycoluril, bisphenol A epoxy resins, 3-methacryloxymethyl-3-ethyloxetane, (4,4'-bis[3-ethyl-3-oxetanyl)methoxymethyl]biphenyl), bis[(3-ethyl-3-oxetanyl)methyl]isophthalate), hexamethoxymethylmelamine, epoxycyclohexane carboxylate mixtures and

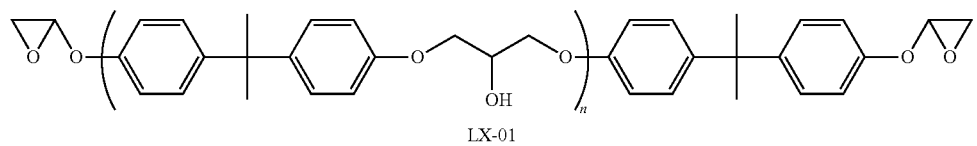

LX-01

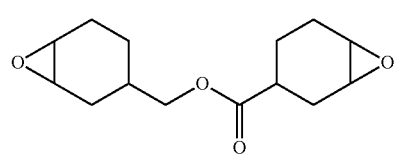

CEL 2021

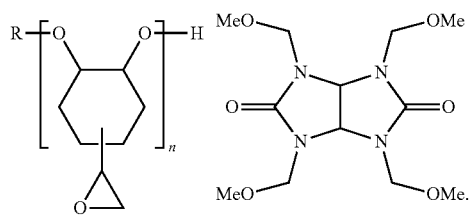

EHPE 3150    Powderlink-1174

13. A method of forming a microelectronic or optoelectronic structure, comprising:
coating a microelectronic or optoelectronic substrate with the polymer composition of claim 11 to form a film;
image wise exposing the film to actinic radiation;
treating the exposed film with an aqueous base developer to form an imaged film; and
curing the imaged film to form a microelectronic or optoelectronic structure.

14. The polymer composition of claim 1, wherein the molar ratio of first repeating units represented by the Formula II1b: phenol-ffinctional_norbornene second repeat units in said polymer is about 1:1.

15. A polymer composition for forming a film comprising:
a polymer comprising a first repeating unit represented by the Formula IIIb:

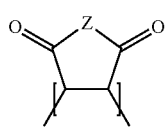

IIIb where Z is O or NR$^5$, where R$^5$ is hydrogen or R*—OH, where R* is an alkyl, aryl, or alkaryl linking group;
a phenol-functional norbornene second repeating unit derived from a monomer selected from the group of norbornene compounds consisting of:

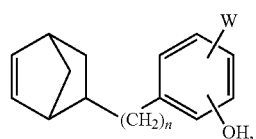

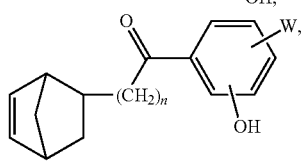

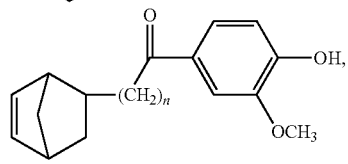

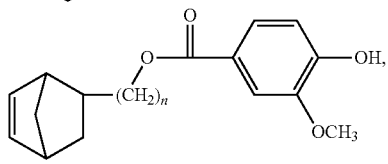

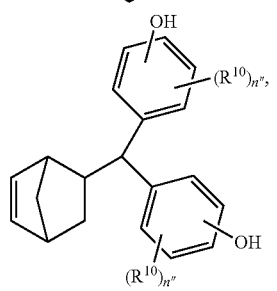 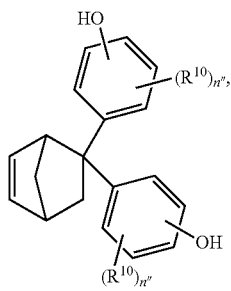

-continued

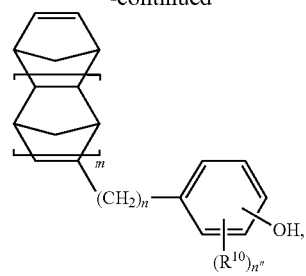

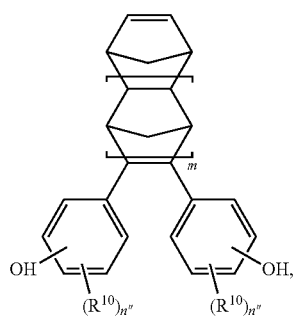

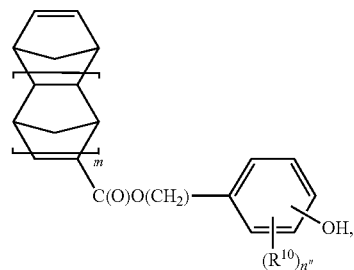

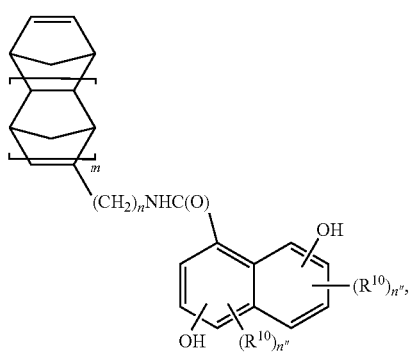

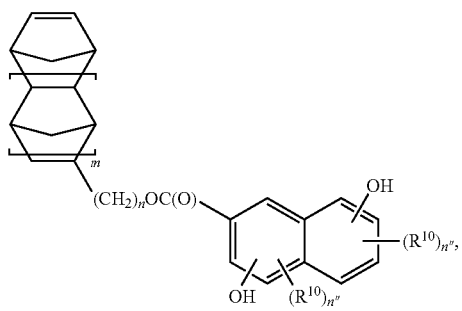

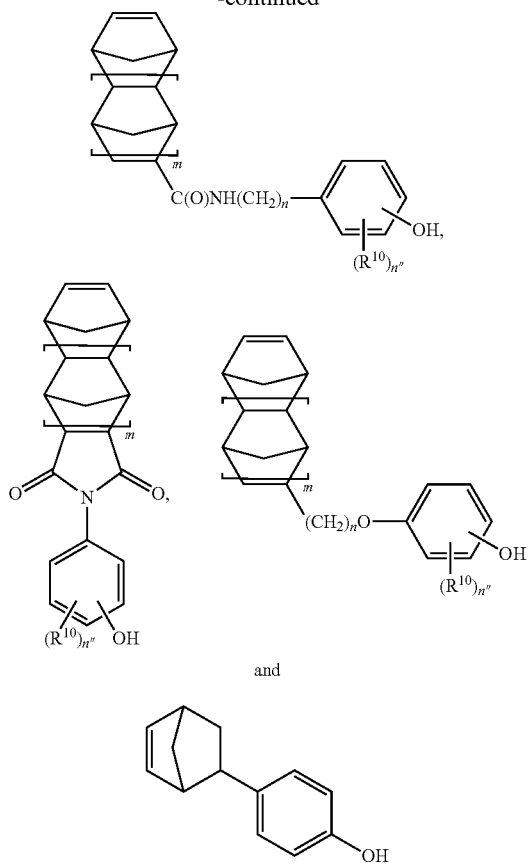

where n is an integer from 1 to 5, W is H or alkyl, or alkoxy; each $R^{10}$ is independently selected from H, a halogen, a monovalent hydrocarbon, an alkoxy, an aryloxy, and an electron withdrawing group; m is an integer from 0 to 5; and each n" is independently an integer from 0 to 4; and a non-phenolic norbornene third repeating unit derived from a monomer selected from the group consisting of:

-continued

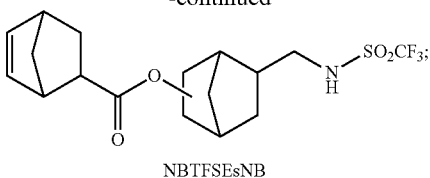

NBTFSEsNB said polymer being produced by reaction of said phenol functional norbornene monomer and the foregoing non-phenolic norbornene monomers with a monomer represented by Formula II:

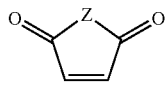

II where Z is defined as above, the reaction being characterized in that the amount of first repeating units represented by the Formula IIIb in the polymer is substantially equivalent to the amount of the monomer of the Formula II incorporated into the polymer;
a casting solvent;
and
(i) a diazo-quinone functional photo active compound or (ii) a photo acid generator in combination with one or more crosslinking additives.

16. The polymer composition of claim 15, wherein the polymer is prepared by way of free radical polymerization.

17. The polymer composition of claim 15, wherein the non-phenolic norbornene third repeating unit is derived from a monomer selected from the group consisting of:

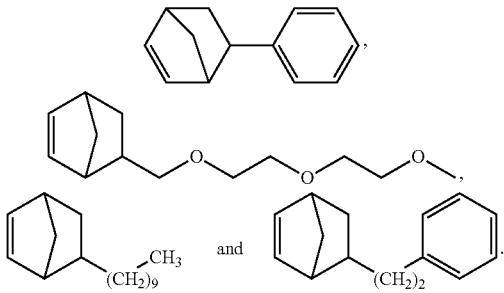

18. The polymer composition of claim 17, wherein the non-phenolic norbornene third repeating unit is derived from:

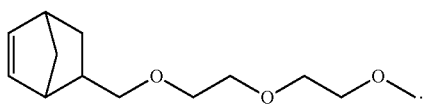

19. The polymer composition of claim 15, wherein the molar ratio of first repeating units represented by the Formula IIIb:phenol-functional norbornene second repeat units and non-phenolic norbornene third repeat units in said polymer is about 1:1.

* * * * *